(12) United States Patent
Xu et al.

(10) Patent No.: US 11,634,355 B2
(45) Date of Patent: Apr. 25, 2023

(54) CERAMIC GLASS POWDER AND SOLAR CELL METALLIZATION PASTE CONTAINING CERAMIC GLASS POWDER

(71) Applicant: Jiangsu Riyu Photovoltaic New Material Technology Co. Ltd, Wuxi (CN)

(72) Inventors: Song Xu, Wuxi (CN); Rui Tian, Wuxi (CN)

(73) Assignee: JIANGSU RIYU PHOTOVOLTAIC NEW MATERIAL TECHNOLOGY, Wuxi (CN)

(*) Notice: Subject to any disclaimer, the term of this patent is extended or adjusted under 35 U.S.C. 154(b) by 0 days.

(21) Appl. No.: 17/680,917

(22) Filed: Feb. 25, 2022

(65) Prior Publication Data
US 2022/0177357 A1 Jun. 9, 2022

Related U.S. Application Data

(63) Continuation of application No. 17/585,693, filed on Jan. 27, 2022, now abandoned.

(30) Foreign Application Priority Data

Dec. 29, 2021 (CN) .......................... 202111633064.1

(51) Int. Cl.
| | |
|---|---|
| *C03C 8/12* | (2006.01) |
| *H01L 31/0224* | (2006.01) |
| *C03C 8/10* | (2006.01) |
| *C03C 8/18* | (2006.01) |
| *C03C 4/14* | (2006.01) |
| *C03C 8/16* | (2006.01) |
| *C03C 3/074* | (2006.01) |
| *C03C 10/00* | (2006.01) |

(52) U.S. Cl.
CPC ................ *C03C 8/12* (2013.01); *C03C 3/074* (2013.01); *C03C 4/14* (2013.01); *C03C 8/10* (2013.01); *C03C 8/16* (2013.01); *C03C 8/18* (2013.01); *H01L 31/022425* (2013.01); *C03C 10/00* (2013.01); *C03C 2204/00* (2013.01); *C03C 2205/00* (2013.01)

(58) Field of Classification Search
CPC .......... C03C 3/072; C03C 3/074; C03C 4/14; C03C 8/10; C03C 8/12; C03C 8/16; C03C 8/18; C03C 8/20; C03C 2204/00; C03C 2205/00
See application file for complete search history.

(56) References Cited

U.S. PATENT DOCUMENTS

| | | | |
|---|---|---|---|
| 2014/0042375 A1* | 2/2014 | Kim | ................ H01L 31/022425 252/514 |
| 2014/0060632 A1* | 3/2014 | Laughlin | ................... C03C 8/18 438/98 |
| 2019/0305150 A1* | 10/2019 | Liu | ......................... H01L 31/18 |

FOREIGN PATENT DOCUMENTS

| | | | | |
|---|---|---|---|---|
| CN | 108766618 A | * | 11/2018 | |
| CN | 113045207 A | * | 6/2021 | ............... C03B 5/16 |
| CN | 113077922 A | * | 7/2021 | |
| JP | 2015071504 A | * | 4/2015 | |
| WO | WO-2019103278 A1 | * | 5/2019 | ............... C03C 8/02 |

\* cited by examiner

*Primary Examiner* — Elizabeth A. Bolden
(74) *Attorney, Agent, or Firm* — IPro, PLLC

(57) ABSTRACT

The present disclosure discloses a ceramic glass powder and a solar cell metallization paste containing the ceramic glass powder, and belongs to the technical field of solar cells. The present disclosure provides a novel formula mode of a glass powder including a crystallization nucleus component and a glass network component, that is, a formula of a ceramic glass powder that has a special crystallization behavior, a low crystallinity before sintering and a high crystallinity after the sintering, and a conductive metallization paste containing the ceramic glass powder is further obtained. The present disclosure solves the technical problem that by using metallization pastes in the prior art, a balance between corrosion of a silicon wafer and an ohmic contact is difficult to achieve. The efficiency of a solar cell is improved.

14 Claims, 1 Drawing Sheet

CERAMIC GLASS POWDER AND SOLAR CELL METALLIZATION PASTE CONTAINING CERAMIC GLASS POWDER

TECHNICAL FIELD

The present disclosure belongs to the technical field of solar cells, and specifically relates to a ceramic glass powder and a solar cell metallization paste containing such ceramic glass powder.

BACKGROUND

A solar cell is a device for converting light energy into electrical energy by using a photovoltaic effect. As a green energy source with wide attention, solar energy is sustainable and produces only pollution-free by-products. Therefore, a large number of industrial and academic studies are conducted to develop the solar cell with enhanced efficiency, and material and manufacturing costs are continuously reduced. When light is incident on the solar cell, a part of the incident light is reflected on a surface, and the rest of the light is transmitted into the solar cell. The transmitted light/photon is absorbed by the solar cell. The solar cell is usually prepared from a semiconductor material, such as silicon. Electrons are excited from atoms of the semiconductor material by using energy of the absorbed photon, and electron-hole pairs are generated. Then, these electron-hole pairs are separated by a p-n junction and collected by a metallization electrode applied to a surface of the solar cell. A typical metallization paste includes a metal particle, a glass powder and an organic medium. During sintering, a glass particle in a composition etches and penetrates through an anti-reflective coating to facilitate a contact between a metal and n+ silicon. On the other hand, the glass needs to be gentle to prevent the p-n junction from being damaged after the sintering. Therefore, the paste is designed to reduce the contact resistance (low Rhoc) while maintaining the integrity of the p-n junction (low Jmet and high Voc), so that the photoelectric conversion efficiency of the cell is improved.

A microstructure obtained after the metallization paste on a front surface is completely sintered is of a silver-interface glass layer-silicon sandwich structure, so that a metallization contact is formed. At present, it has been reported that a metallization contact mechanism includes a direct contact between silver and silicon and a tunneling contact between the silver and the silicon through an interface glass layer. From the perspective of controlling a balance between corrosion of a silicon wafer and an ohmic contact, the cell efficiency can be improved by using the tunneling contact.

During sintering of a solar cell metallization paste, there are three temperature zones (shown in FIG. 1). A first zone is a low-temperature sintering zone, where an organic part is volatilized or ashed. A second zone is a high-temperature heating zone, where a glass powder rapidly melts and flows to a silver-silicon interface, a silver powder is sintered, and then the silver metal and ions are dissolved into molten glass until a peak temperature is reached. A third zone is a rapid cooling zone, where the molten glass is rapidly cooled and solidified, the silver powder is completely sintered to form a dense structure, and the glass is remained on the silver-silicon interface. Therefore, how to accurately control the state of the glass powder in the second and third temperature zones, complete expected physical and chemical reactions, form a great silver-silicon interface contact layer and achieve the balance between the corrosion of the silicon wafer and the ohmic contact, is the key to improve the photoelectric conversion efficiency of the cell.

SUMMARY

In order to solve the problems above, based on design of a functional idea, the present disclosure innovatively invents a novel formula of a ceramic glass powder including a crystallization nucleus component and a glass network component, and the glass powder has a low crystallinity before sintering and a high crystallinity after the sintering is prepared. According to the ceramic glass powder of the present disclosure, during rapid cooling, a large number of nanocrystals are rapidly formed on an interface glass layer to serve as crystallization centers of silver particles, and a large number of colloidal silver particles are solidified in the interface glass layer, so that the conductivity of the glass layer is greatly improved based on the tunneling effect. Therefore, a controllable ideal balance between corrosion of a silicon wafer and an ohmic contact is achieved, and that is, a balance between Voc and Rs in cell parameters is achieved, so that the efficiency of a cell is improved.

An objective of the present disclosure is to provide a ceramic glass powder. The ceramic glass powder has a crystallinity of less than 5% (m/m) and includes a crystallizatin nucleus forming component and a glass network component.

The crystallization nucleus forming component includes any of the following components: zinc oxide (ZnO), magnesium oxide (MgO), sodium oxide ($Na_2O$), zirconium oxide ($ZrO_2$) and copper oxide (CuO), and the zinc oxide (ZnO) and the magnesium oxide (MgO) are essential components.

The glass network component includes any of the following components: an alkali metal oxide, aluminum oxide ($Al_2O_3$), tellurium oxide ($TeO_2$), lead oxide (PbO), silicon oxide ($SiO_2$), boron oxide ($B_2O_3$), bismuth oxide ($Bi_2O_3$) and titanium oxide ($TiO_2$), and except for the titanium oxide ($TiO_2$), all the other components are essential components.

In an example of the present disclosure, based on a weight percentage relative to the glass network component, the crystallization nucleus forming component includes one or more of the following oxides:

the zinc oxide (ZnO): 0.1-10%,
the magnesium oxide (MgO): 0.1-8%,
the sodium oxide ($Na_2O$): 0-5%,
the zirconium oxide ($ZrO_2$): 0-8%, and
the copper oxide (CuO): 0-5%; and the glass network component includes one or more of the following oxides:

the alkali metal oxide: 0.1-10%,
the aluminum oxide ($Al_2O_3$): 0.1-5%,
the tellurium oxide ($TeO_2$): 10-80%,
the lead oxide (PbO): 10-80%,
the silicon oxide ($SiO_2$): 10-20%,
the boron oxide ($B_2O_3$): 1-20%,
the bismuth oxide ($Bi_2O_3$): 1-30%, and
the titanium oxide ($TiO_2$): 0-5%, where, the alkali metal oxide is any one or more selected from the group consisting of $Li_2O$ and $K_2O$.

In an example of the present disclosure, a formula of the ceramic glass powder further includes one or more of oxides of the following metals: W, V, Cr, Mn, Co, Ni, Nb, Ta, Th, Ge, Mo, La, Sb or Ce.

In an example of the present disclosure, based on a weight percentage relative to the glass network component, the crystallization nucleus forming component preferably includes:
the zinc oxide (ZnO): 4-5%,
the magnesium oxide (MgO): 2-3%,
the sodium oxide ($Na_2O$): 0-2%,
the zirconium oxide ($ZrO_2$): 0-1%, and
the copper oxide (CuO): 0-1%.

In an example of the present disclosure, the crystallization nucleus forming component has a mass fraction of 8% relative to the glass network component.

In an example of the present disclosure, based on a weight percentage relative to the glass network component, the composition of the crystallization nucleus forming component in a formula of the ceramic glass powder further preferably includes:
the zinc oxide (ZnO): 4%,
the magnesium oxide (MgO): 3%, and
the sodium oxide ($Na_2O$): 1%;
or,
the zinc oxide (ZnO): 4%,
the magnesium oxide (MgO): 3%, and
the copper oxide (CuO): 1%.

In an example of the present disclosure, the glass network component in a formula of the ceramic glass powder preferably includes the following oxides:
the aluminum oxide ($Al_2O_3$): 1%,
the lead oxide (PbO): 30%,
the bismuth oxide ($Bi_2O_3$): 5%,
the boron oxide ($B_2O_3$): 1%,
the silicon oxide ($SiO_2$): 10%,
the tellurium oxide ($TeO_2$): 43%, and
the alkali metal oxide ($Li_2O$): 10%;
or,
the aluminum oxide ($Al_2O_3$): 1%,
the lead oxide (PbO): 29%,
the bismuth oxide ($Bi_2O_3$): 5%,
the boron oxide ($B_2O_3$): 1%,
the silicon oxide ($SiO_2$): 10%,
the tellurium oxide ($TeO_2$): 43%,
the alkali metal oxide ($Li_2O$): 10%, and
the titanium oxide ($TiO_2$): 1%.

In an example of the present disclosure, a method for preparing the ceramic glass powder includes the following processes:

(1) uniformly mixing and melting the oxide components in the crystallization nucleus forming component to obtain a glass melt; and (2) adding the glass network component into the glass melt for secondary melting to obtain a melt, conducting quenching on the melt to obtain a glass slag, and then conducting grinding and sieving to obtain the ceramic glass powder.

In an example of the present disclosure, the melting in step (1) is conducted at a temperature of 500-1,300° C. for 30 min.

In an example of the present disclosure, the secondary melting in step (2) is conducted at a temperature of 1,000° C. for 60 min.

In an example of the present disclosure, the quenching in step (2) is conducted by using water or a counter-roller cooler.

In an example of the present disclosure, the grinding in step (2) is conducted by using a ball mill or a jet mill.

In an example of the present disclosure, the grinding in step (2) is conducted until an average particle size (d50) is about 0.01-10 μm, preferably about 0.1-5 μm.

In an example of the present disclosure, the sieving in step (2) is conducted by using a 325-mesh sieve.

In an example of the present disclosure, the ceramic glass powder is prepared by using a melting and quenching method, or other non-high-temperature wet chemical methods.

In an example of the present disclosure, the typical melting and quenching method includes the steps of mixing an appropriate amount of raw materials (usually in the form of powder), and melting an obtained mixture into molten glass at a temperature of 500-1,300° C. to form a uniform melt; and quenching the melt (by using water or a cooling roller), grinding the melt by using a ball mill or a jet mill, conducting sieving, and then conducting secondary grinding on an obtained crude powder, for example, in the ball mill or the jet mill until a fine powder is obtained.

The wet chemical methods for preparing the ceramic glass powder include, but are not limited to, a sol-gel method, a precipitation method, a hydrothermal/solvothermal method and a pyrolysis method. The quenching of the glass melt is an important step to ensure that the ceramic glass in the present disclosure has a low crystallinity.

The present disclosure further provides a solar cell metallization paste. The solar cell metallization paste includes (a) a conductive metal component, (b) the ceramic glass powder above and (c) an organic carrier.

In an example of the present disclosure, the conductive metal component includes silver, gold, platinum, palladium, copper, nickel and a combination thereof.

In an example of the present disclosure, the ceramic glass powder is 1-10% of the paste by weight percentage.

In an example of the present disclosure, the organic carrier includes an organic solvent and one or any combination selected from the group consisting of a binder, a surfactant and a thixotropic agent.

In an example of the present disclosure, the organic solvent is one or any combination selected from the group consisting of carbitol, terpineol, hexyl carbitol, 2,2,4-trimethyl-1,3-pentanediol monoisobutyrate, butyl carbitol, butyl carbitol acetate and dimethyl adipate glycol ether.

In an example of the present disclosure, the binder is one or any combination selected from the group consisting of ethyl cellulose, phenolic resin, polyacrylic acid, polyvinyl butyral, polyester resin, polycarbonate, polyethylene resin, polyurethane resin and a rosin derivative.

In an example of the present disclosure, the surfactant is one or any combination selected from the group consisting of polyethylene oxide, polyethylene glycol, benzotriazole, poly(ethylene glycol) acetic acid, lauric acid, oleic acid, capric acid, myristic acid, linoleic acid, stearic acid, palmitic acid, stearate and palmitate.

In an example of the present disclosure, a metallization silver paste is prepared in the following steps:
step 1: preparing an organic carrier;
step 2: selecting a ceramic glass powder and a conductive silver powder; and
step 3: grinding the raw materials according to a ratio above by using a stirrer and a three-roller grinder to form a fine and uniform lead-free environment-friendly silver paste without particles for a back electrode of a solar cell.

The present disclosure further provides a solar cell containing the solar cell metallization paste on a surface.

In an example of the present disclosure, the above solar cell metallization silver paste and an aluminum paste are printed on the front surface and back surface of a silicon wafer in predetermined patterns by screen printing respectively and then dried. Then, the printed silicon wafer is subjected to sintering at 400-900° C. After the sintering is completed, the silicon wafer is cooled to room temperature to obtain a solar cell.

In an example of the present disclosure, the sintering is conducted for 30-50 s.

The Present Disclosure has the Following Beneficial Effects.

The present disclosure provides a formula of a ceramic glass powder that has a special crystallization behavior, a low crystallinity before sintering and a high crystallinity after the sintering, and also designs a conductive metallization paste containing the ceramic glass powder. The present disclosure solves the technical problem that by using metallization pastes in the prior art, a balance between corrosion of a silicon wafer and an ohmic contact is difficult to achieve. The present disclosure has the advantages that during rapid cooling of a cell, a large number of the nanocrystals are rapidly formed on the interface glass layer to serve as the crystallization centers of the silver particles, and a large number of the colloidal silver particles are solidified in the interface glass layer, so that the conductivity of the glass layer is greatly improved based on the tunnel effect. Therefore, a controllable ideal balance between the corrosion of the silicon wafer and the ohmic contact is achieved, and that is, a balance between the Voc and the Rs in the cell parameters is achieved, so that the photoelectric conversion efficiency of the cell is improved.

DETAILED DESCRIPTION

Figure 1:
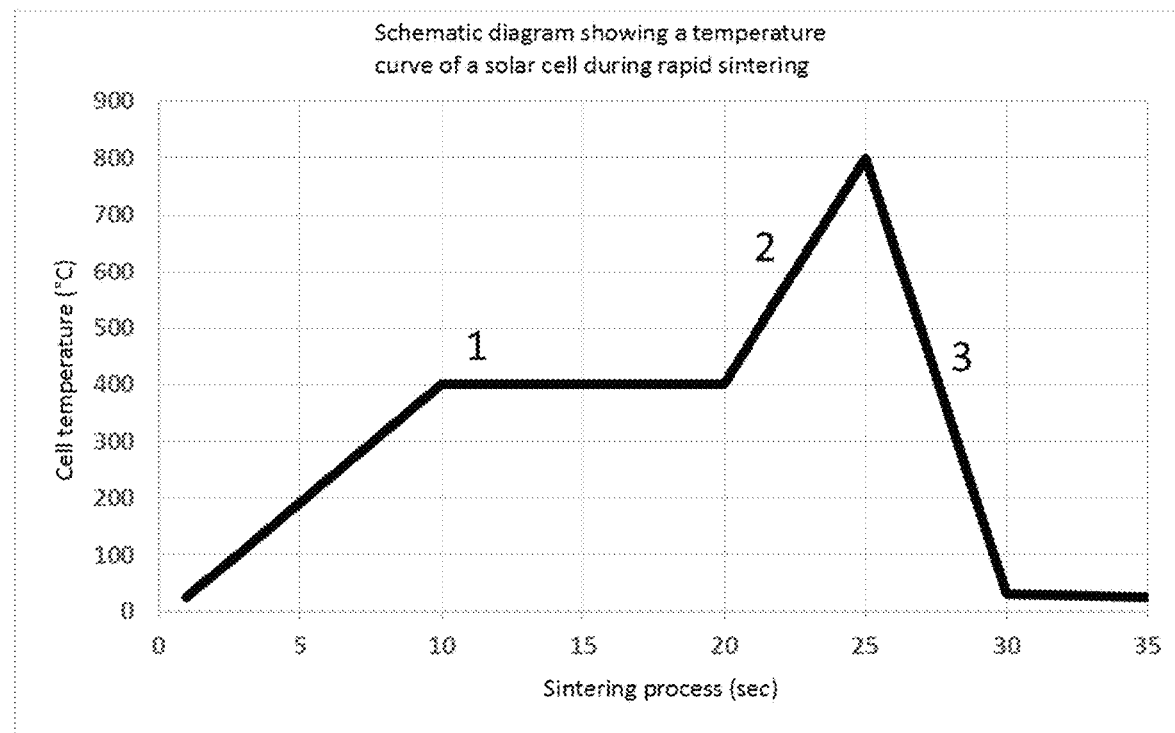
FIG. 1 is a schematic diagram showing a temperature curve of a solar cell during rapid sintering.

The crystallinity of a glass powder in the present disclosure is determined.

The crystallinity of glass is determined by referring to two reliable determination methods (with reference to the literatures: Determination of crystallinity in crystallized glasses by X-ray diffraction. *Journal of Non-Crystalline Solids.* 1976, Volume 21, Issue 1, Pages 125-136; and A method to quantify crystallinity in amorphous metal alloys: A differential scanning calorimetry study. *PLoS One.* 2020, 22; 15(6)). One method includes determining the crystallinity of a glass powder before and after sintering by using DSC and observing changes of the crystallinity. The other method includes adding crystallized $SiO_2$ as an internal standard in powder XRD, determining a specific crystallinity and then accurately determining the crystallinity of a glass powder before and after sintering. The crystallinities obtained by using the two determination methods are highly consistent. Therefore, in the following examples, the relatively simple and easy-to-operate method for determining the crystallinity by using the DSC is mainly used.

Example 1 Preparation of Ceramic Glass Powders

Ceramic glass powders (CG1 to CG5) were prepared by using components in Table 1. A glass powder G0 without a crystallization nucleus forming component was also prepared as a control. The ceramic glass powders were prepared by mixing oxide components in weight percentage specified in Table 1 (200 g of a glass network component was prepared in batches).

In the first step, a mixture of the oxides in the crystallization nucleus forming component were put in a platinum crucible with a volume of 0.5 L, and then the crucible was put in a glass melting furnace at 1,300° C. for 30 min to obtain a glass melt.

In the second step, the glass network component was added into the glass melt obtained in the first step and subjected to melting at 1,000° C. for 60 min, the melt was taken out and poured into a counter-roller cooler for quenching (an ST155 counter-roller cooling pulverizer for glass, made by Fred in Changzhou, with operating conditions: rotation speed 50 rpm, and ice water for cooling) to obtain a glass slag, and the glass slag was ground by using a 1 L planetary ball mill and then sieved with a 325-mesh sieve to obtain the ceramic glass powder.

TABLE 1

Comparisons of crystallinity results of the ceramic glass powders before and after sintering according to different formulas

|  |  | G0 | CG1 | CG2 | CG3 | CG4 | CG5 | CG6 | CG7 |
| --- | --- | --- | --- | --- | --- | --- | --- | --- | --- |
| Crystallization nucleus forming component | ZnO | — | 5% | 4% | 4% | 4% | 4% | 3% | 1% |
|  | MgO | — | 3% | 3% | 2% | 3% | 3% | 2% | 3% |
|  | $Na_2O$ | — |  | 1% | 2% | — | — | 1% | 1% |
|  | CuO | — | — | — | — | 1% | — | 1% | 3% |
|  | $ZrO_2$ | — | — | — | — | — | 1% | 1% | — |
| Glass network component | $Al_2O_3$ | 1% | 1% | 1% | 1% | 1% | 1% | 1% | 1% |
|  | PbO | 30% | 29% | 30% | 29% | 30% | 30% | 30% | 30% |
|  | $Bi_2O_3$ | 5% | 5% | 5% | 5% | 5% | 5% | 5% | 5% |
|  | $B_2O_3$ | 1% | 1% | 1% | 1% | 1% | 1% | 1% | 1% |
|  | $SiO_2$ | 10% | 10% | 10% | 10% | 10% | 10% | 10% | 10% |
|  | $TeO_2$ | 43% | 43% | 43% | 43% | 43% | 43% | 43% | 43% |
|  | $Li_2O$ | 10% | 10% | 10% | 10% | 10% | 10% | 10% | 10% |
|  | $TiO_2$ | — | 1% | — | 1% | — | — | — | — |
| Crystallinity before sintering |  | 2% | 2% | 3% | 4% | 4% | 4% | 20% | 20% |
| Crystallinity after sintering |  | 3% | 60% | 70% | 70% | 70% | 70% | 30% | 30% |

The "sintering" process in Table 1 indicated that the ceramic glass powder was subjected to sintering in a RTP sintering furnace at 900° C. for 30 s.

Example 2 Preparation of Solar Cell Metallization Pastes

A list of components used in the following examples and comparative examples was as follows:

(1) a conductive powder: a spherical silver powder (AG-4-8, Dowa HighTech Co., Ltd.) with an average particle diameter (D50) of 2 μm;

(2) a ceramic glass powder: G0 and CG1-CG7 were separately selected; and (3) an organic carrier:

(3a) a binder: ethyl cellulose (Dow Chemical Co., Ltd., STD4), (3b) a solvent: terpilenol (Nippon Terpine Co., Ltd.), and (3c) a thixotropic agent: DISPARLON 6500 (Kusumoto Chemicals, Ltd.).

1 wt % of the ethyl cellulose and 1 wt % of the thixotropic agent were fully dissolved in 6 wt % of the terpineol at 50° C., 90 wt % of the Ag powder and 2 wt % of the crystallized glass powders were added to obtain uniformly mixed solutions, and the solutions were mixed by using a three-roller mixer and then dispersed to obtain solar cell metallization silver pastes P0-P7 respectively.

Example 3 Preparation of Solar Cells

The solar cell metallization silver pastes P0-P7 obtained in Example 2 and an aluminum paste were printed on the front surfaces and back surfaces of silicon wafers in predetermined patterns by screen printing and then dried in an infrared drying oven. The printed silicon wafers were rapidly sintered in a sintering furnace at 900° C. for 30 s and then cooled to room temperature to obtain solar cells.

Figure 2:
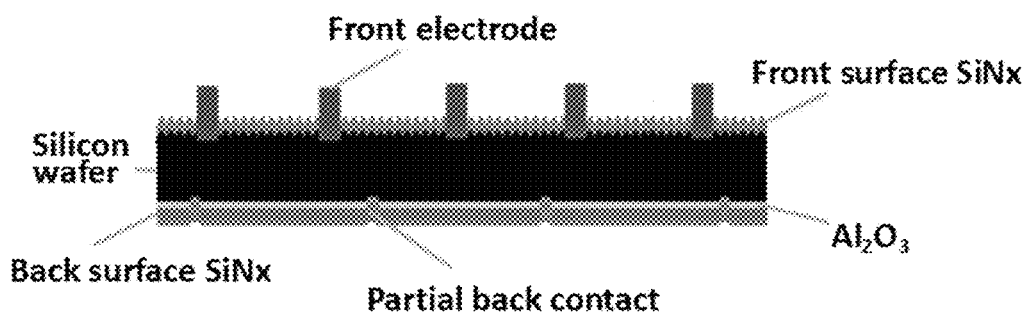
FIG. 2 is a schematic structural diagram of a solar cell.

The structure of the obtained solar cell was shown in FIG. 2. The metallization silver paste was sintered to serve as a front electrode, and the aluminum paste was sintered to form a partial back contact. The pure silicon wafer was of a front surface $SiN_x$-silicon wafer-$Al_2O_3$-back surface $SiN_x$ structure.

The series resistance (Rs), open circuit voltage (Voc), fill factor (FF) and photoelectric conversion efficiency (Eff., %) of the solar cells were determined by using a solar cell IV tester (HALM). Results were shown in Table 2 and Table 3. It could be seen that by using the metallization paste including the ceramic glass, the photoelectric conversion efficiency could be significantly improved.

TABLE 2

Performance results of the solar cells prepared from different ceramic glass powders

|  | P0 | P1 | P2 | P3 | P4 | P5 | P6 | P7 |
| --- | --- | --- | --- | --- | --- | --- | --- | --- |
| Series resistance Rs (mΩ) | 1.05 | 1.02 | 0.96 | 0.98 | 0.95 | 1.03 | 1.2 | 1.25 |
| Open circuit voltage Voc (mV) | 690 | 690.5 | 690.6 | 690 | 691 | 691 | 690 | 689 |
| Fill factor FF (%) | 82.32 | 82.44 | 82.57 | 82.3 | 82.6 | 82.3 | 82 | 82.4 |
| Photoelectric conversion efficiency Eff. (%) | 22.98 | 23.1 | 23.17 | 23.07 | 23.14 | 23.09 | 22.6 | 22.4 |

TABLE 3

Relative performance results of the solar cells prepared from different ceramic glass powders relative to a control (with reference to P0 as a 100% control)

|  | P0 | P1 | P2 | P3 | P4 | P5 | P6 | P7 |
| --- | --- | --- | --- | --- | --- | --- | --- | --- |
| Series resistance (Rs) | 100% | 97% | 91% | 93% | 90% | 98% | 114% | 119% |
| Open circuit voltage (Voc) | 100% | 100% | 100% | 100% | 100% | 100% | 100% | 100% |
| Fill factor (FF) | 100% | 100% | 100% | 100% | 100% | 100% | 100% | 100% |
| Photoelectric conversion efficiency (Eff.) | 100% | 100.52% | 100.83% | 100.39% | 100.70% | 100.48% | 98.35% | 97.48% |

At present, the photoelectric conversion efficiency of the crystalline silicon solar cell PERC-SE is about 23%, which is obtained by improving the absolute efficiency by 0.1-0.2% every year for more than ten years. Therefore, it is a huge improvement that the absolute efficiency is improved by 0.1% when the metallization paste is used. Based on the photoelectric conversion efficiency of 23%, when the absolute efficiency is improved by 0.1%, the relative efficiency is improved by 0.43%.

During testing of the solar cells of the present disclosure, based on the electrical performance test results (series resistance, open circuit voltage, fill factor and efficiency), statistical confidence analysis (p-value analysis) is conducted. There are significant differences ($p<0.05$) between the test samples and the reference sample. Therefore, differences caused by test errors are avoided.

What is claimed is:

1. A ceramic glass powder, wherein the ceramic glass powder has a crystallinity of less than 5% (m/m) and comprises a crystallization nucleus forming component and a glass network component;
    wherein the crystallization nucleus forming component comprises 4-5 wt % of zinc oxide (ZnO), 2-3 wt % of magnesium oxide (MgO), 0-5 wt % of sodium oxide ($Na_2O$), 0-8 wt % of zirconium oxide ($ZrO_2$), and 0-5 wt % of copper oxide (CuO); and
    wherein the glass network component comprises 0.1-10 wt % of alkali metal oxide, 0.1-5 wt % of aluminum oxide ($Al_2O_3$), 10-80 wt % of tellurium oxide ($TeO_2$), 10-80 wt % of lead oxide (PbO), 10-20 wt % of silicon oxide ($SiO_2$), 1-20 wt % of boron oxide ($B_2O_3$), 1-30 wt % of bismuth oxide ($Bi_2O_3$), and 0-5 wt % of titanium oxide ($TiO_2$), wherein the alkali metal oxide is selected from the group consisting of $Li_2O$, $K_2O$ and combinations thereof;
    wherein all the weight percentages are based on the weight of the glass network component.

2. The ceramic glass powder according to claim 1, wherein the glass network component comprises 1 wt % of $Al_2O_3$, 30 wt % of PbO, 5 wt % of $Bi_2O_3$, 1 wt % of $B_2O_3$, 10 wt % of $SiO_2$, 43 wt % of $TeO_2$ and 10 wt % of $Li_2O$;
    or wherein the glass network component comprises 1 wt % of $Al_2O_3$, 29 wt % of PbO, 5 wt % of $Bi_2O_3$, 1 wt % of $B_2O_3$, 10 wt % of $SiO_2$, 43 wt % of $TeO_2$, 10 wt % of $Li_2O$ and 1 wt % of $TiO_2$; wherein all the weight percentages are based on the weight of the glass network component.

3. The ceramic glass powder according to claim 1, wherein the crystallization nucleus forming component comprises 0-2 wt % of $Na_2O$, 0-1 wt % of $ZrO_2$ and 0-1 wt % of CuO; wherein all the weight percentages are based on the weight of the glass network component.

4. The ceramic glass powder according to claim 1, wherein the weight of the crystallization nucleus forming component is 8% of the weight of the glass network component.

5. The ceramic glass powder according to claim 1, wherein the crystallization nucleus forming component comprises 4 wt % of ZnO, 3 wt % of MgO and 1 wt % of $Na_2O$; or wherein the crystallization nucleus forming component comprises 4 wt % of ZnO, 3 wt % of MgO and 1 wt % of CuO; wherein all the weight percentages are based on the weight of the glass network component.

6. A method for preparing the ceramic glass powder of claim 1, comprising:
    (1) uniformly mixing and melting the oxides of the crystallization nucleus forming component to obtain a glass melt; and
    (2) adding the oxides of the glass network component into the glass melt obtained in step (1) for secondary melting to obtain a melt, conducting quenching on the melt to obtain a glass slag, and then conducting grinding and sieving to obtain the ceramic glass powder.

7. A solar cell metallization paste containing the ceramic glass powder according to claim 1, wherein the solar cell metallization paste comprises: (a) a conductive metal component, (b) the ceramic glass powder and (c) an organic carrier.

8. The solar cell metallization paste according to claim 7, wherein the conductive metal component comprises silver, gold, platinum, palladium, copper, nickel and a combination thereof.

9. The solar cell metallization paste according to claim 7, wherein the ceramic glass powder is 1-10% of the paste by weight percentage.

10. A solar cell containing the solar cell metallization paste according to claim 7 on a surface.

11. The solar cell metallization paste according to claim 7, wherein the organic carrier comprises an organic solvent and one or any combination selected from the group consisting of a binder, a surfactant and a thixotropic agent.

12. The solar cell metallization paste according to claim 11, wherein the organic solvent is one or any combination selected from the group consisting of carbitol, terpineol, hexyl carbitol, 2,2,4-trimethyl-1,3-pentanediol monoisobutyrate, butyl carbitol, butyl carbitol acetate and dimethyl adipate glycol ether.

13. The solar cell metallization paste according to claim 11, wherein the binder is one or any combination selected from the group consisting of ethyl cellulose, phenolic resin, polyacrylic acid, polyvinyl butyral, polyester resin, polycarbonate, polyethylene resin, polyurethane resin and a rosin derivative.

14. The solar cell metallization paste according to claim 11, wherein the surfactant is one or any combination selected from the group consisting of polyethylene oxide, polyethylene glycol, benzotriazole, poly(ethylene glycol) acetic acid, lauric acid, oleic acid, capric acid, myristic acid, linoleic acid, stearic acid, palmitic acid, stearate and palmitate.

* * * * *

UNITED STATES PATENT AND TRADEMARK OFFICE
CERTIFICATE OF CORRECTION

| | | |
|---|---|---|
| PATENT NO. | : 11,634,355 B2 | Page 1 of 1 |
| APPLICATION NO. | : 17/680917 | |
| DATED | : April 25, 2023 | |
| INVENTOR(S) | : Song Xu et al. | |

It is certified that error appears in the above-identified patent and that said Letters Patent is hereby corrected as shown below:

On the Title Page

Item (12) should read: Yan et al.

Item (72) should read: Li YAN, Wuxi (CN); Song XU, Wuxi (CN); Rui TIAN, Wuxi (CN)

Signed and Sealed this
Twenty-fifth Day of February, 2025

Coke Morgan Stewart
*Acting Director of the United States Patent and Trademark Office*